United States Patent
Addicott

(10) Patent No.: US 10,191,475 B2
(45) Date of Patent: Jan. 29, 2019

(54) VIRTUAL COMPONENT ALIGNMENT

(71) Applicant: ROLLS-ROYCE PLC, London (GB)

(72) Inventor: Paul David Addicott, Bristol (GB)

(73) Assignee: ROLLS-ROYCE plc, London (GB)

( * ) Notice: Subject to any disclaimer, the term of this patent is extended or adjusted under 35 U.S.C. 154(b) by 475 days.

(21) Appl. No.: 14/857,237

(22) Filed: Sep. 17, 2015

(65) Prior Publication Data

US 2016/0109876 A1   Apr. 21, 2016

(30) Foreign Application Priority Data

Oct. 16, 2014 (GB) .................................. 1418349.5

(51) Int. Cl.
*G01B 9/08* (2006.01)
*G01B 11/00* (2006.01)
(Continued)

(52) U.S. Cl.
CPC ....... *G05B 19/4099* (2013.01); *G05B 19/401* (2013.01); *G05B 19/4207* (2013.01); *F05D 2230/18* (2013.01); *G01B 9/08* (2013.01); *G01B 11/03* (2013.01); *G05B 19/4097* (2013.01); *G05B 2219/32228* (2013.01); *G05B 2219/35128* (2013.01); *G05B 2219/35134* (2013.01); *G05B 2219/37205* (2013.01); *G05B 2219/37617* (2013.01); *G05B 2219/45147* (2013.01); *G06F 17/50* (2013.01)

(58) Field of Classification Search
CPC ........ G05B 19/401; G05B 2219/37617; G05B 19/408; F05D 2230/18
USPC ............................................. 700/98; 702/183
See application file for complete search history.

(56) References Cited

U.S. PATENT DOCUMENTS

| | | | | |
|---|---|---|---|---|
| 4,811,253 A | * | 3/1989 | Johns | .................. G05B 19/401 33/546 |
| 5,446,673 A | * | 8/1995 | Bauer | .................... G01B 17/02 700/195 |

(Continued)

FOREIGN PATENT DOCUMENTS

| DE | 102007048588 A1 | 4/2009 |
|---|---|---|
| EP | 0199961 A2 | 11/1986 |

(Continued)

OTHER PUBLICATIONS

Mar. 29, 2015 Search Report issued in British Patent Application No. 1418349.5.

(Continued)

*Primary Examiner* — Ly D Pham
(74) *Attorney, Agent, or Firm* — Oliff PLC

(57) ABSTRACT

This invention concerns improvements in the inspection, assessment and re-working of manufactured components such as nozzle guide vanes (NGVs) and blades, in particular by improving the comparison of the component with nominal data. Dimensional data of a physical component is obtained and used to create a virtual digitized model of the component which is aligned with a nominal CAD model of the component in a virtual space. The correspondence is assessed and used to adjust weightings of different regions of the digitized model to improve the alignment. This process is repeated within the digital space until either conformance is reached or it is determined that this is not possible.

16 Claims, 3 Drawing Sheets

(51) Int. Cl.
  *G06F 17/50* (2006.01)
  *G05B 19/4097* (2006.01)
  *G05B 19/4099* (2006.01)
  *G05B 19/401* (2006.01)
  *G05B 19/42* (2006.01)
  *G01B 11/03* (2006.01)

(56) References Cited

U.S. PATENT DOCUMENTS

| | | | |
|---|---|---|---|
| 5,796,400 | A | 8/1998 | Atkinson et al. |
| 5,892,691 | A | 4/1999 | Fowler |
| 6,665,080 | B1 * | 12/2003 | Haertig ............... G05B 19/401 |
| | | | 356/601 |
| 6,969,821 | B2 * | 11/2005 | Mika ..................... B23P 6/002 |
| | | | 219/121.83 |
| 2005/0149298 | A1 * | 7/2005 | Soman ............... G05B 19/4097 |
| | | | 702/189 |
| 2011/0130854 | A1 | 6/2011 | Lettenbauer et al. |
| 2014/0257543 | A1 | 9/2014 | Rhodes et al. |
| 2016/0370172 | A1 * | 12/2016 | Christoph .............. G01B 5/012 |

FOREIGN PATENT DOCUMENTS

| | | |
|---|---|---|
| GB | 2350809 A | 12/2000 |
| WO | 2004/071717 A1 | 8/2004 |
| WO | 2006/097926 A2 | 9/2006 |

OTHER PUBLICATIONS

Mar. 11, 2016 Search Report issued in European Patent Application No. 15185609.

\* cited by examiner

VIRTUAL COMPONENT ALIGNMENT

BACKGROUND OF THE INVENTION

The present invention relates to improvements in the inspection, assessment and re-working of manufactured components to improve uniformity, reduce the level of physical reworking of the parts and reduce the number of scrap parts. In particular, the invention relates to a virtual alignment system and method for components such as nozzle guide vanes (NGVs) and blades from a gas turbine.

Components such as nozzle guide vanes (NGVs) and blades are often created using precision casting techniques. In particular, investment casting techniques are often used, particularly where complex internal cooling geometry has to be formed within the component. These casting techniques inherently produce levels of dimensional variation that can exceed drawing specifications for the components in question. In order to rectify the dimensional variations from the casting process, as well as to improve the surface finish and bring the parts back into dimensional conformance, it is common for the components to be manually inspected and finished by hand using linishing belts and wheels.

Briefly, the process typically starts with a skilled operator measuring a part for wall section thickness and dimensional conformance with drawings using a known technique such as ultrasonic and/or Coordinate Measuring Machine (CMM). If the part does not conform with the drawings, the operator then has to decide if the component can be reworked either by simply removing all material that lies outside the drawing limits or, if there are areas where material is 'missing' in comparison to the drawings, by removing material selectively from the datum locations to bring the overall part back into conformance. If the part is deemed not to be reworkable, it is scrapped.

The input of the operator in the process allows parts that might otherwise be scrapped to be salvaged and reworked. In particular, a part that shows missing, or 'negative', material when aligned using the defined datum points for that part would otherwise be scrapped because these voids cannot simply be filled. By using their knowledge of the datum locations together with dimensional data obtained from multiple measuring devices a user can, in many cases, remove material specifically from the datum locations of a part (e.g. a gas turbine NGV or blade) and move the part in 3D space to bring all the features back within drawing tolerances.

The method is reasonably effective in recovering parts that might otherwise be scrapped, but being a manual operation it is highly dependent upon the skill and experience of the individual operator. The operator must use the dimensional data and the knowledge of the part datum system to ensure the external conformance of the component while often also ensuring the integrity of the wall section of the part. This can be extremely difficult, especially for parts with complex core geometries or cooling passages where the wall thickness of the part can vary significantly from one location to another. The user must be extremely careful to maintain a minimum required thickness in all locations without the benefit of any external indication of the local wall thickness during the operation.

Additionally, parts can have complex three dimensional shapes with as many as nine interrelated datum points being used for alignment. Removing material from one location risks moving one or more points outside the drawing tolerances, which would then necessitate an additional reworking operation subject to the same risks as outlined above.

It should be understood, therefore, that the manual operation described above is, by its nature, susceptible to high variation in effectiveness. Even highly skilled operators can struggle due to the large number of interrelated parameters that must be considered and the limited visual feedback during the work. This results in inconsistency of dimensional conformance of the parts within the tolerance bands. This can then lead to decreased performance of the part when used in service.

Furthermore, if insufficient skill or care is used in the re-working process, a theoretically recoverable part will still need to be scrapped because, for example, removal of material from one datum point either moves other parts of the component too far from the drawing tolerances to be recoverable or reduces the wall thickness in an area below the minimum allowed.

Due to the risks associated with removing too much material or removing material from the wrong place, the reworking operation is typically iterative, with several small adjustments being made and the component being re-measured between each adjustment, making the manual inspection and processing inefficient and time consuming.

The manual processing/reworking described above can thus be seen to lead to unnecessary amounts of reworking, which in certain cases can still result in a component that must be scrapped. The linishing belts and wheels typically used for the reworking also expose the operators to hand and arm vibration, so there are additional health and safety issues associated with the manual processing of the components.

It would be beneficial, therefore, if such manual processing could be minimised, or possibly avoided altogether.

It is an aim of the present invention to provide an improved means for inspecting and adapting components for conformity that does not rely so heavily on manual input and expertise.

BRIEF SUMMARY OF THE INVENTION

In a first aspect, the invention provides a system for the reworking of a three dimensional component to conform with pre-defined nominal dimensions and tolerances (the tolerances defined by a maximum tolerance and a minimum tolerance for any given region of the component) comprising;
  a device for capturing dimensional data of the component; the device in data communication with a processor;
  the processor including a memory in which the pre-defined nominal dimensions and tolerances are stored as a nominal CAD model and the processor configured for performing the steps of;
  a) creating a virtual digitised model of the component from the captured dimensional data;
  b) aligning the digitised model with the nominal CAD model using a component datum system;
  c) assessing the correspondence of the digitised model with the nominal CAD model;
  d) comparing one or more regions of the digitised model with the CAD model and identifying regions where the digitised model does not exceed a tolerance minimum;
  e) adjusting the alignment of the digitised model with the CAD model to bring regions identified in step d) to a position where they meet or exceed the tolerance minimum;
  f) comparing one or more regions of the digitised model with the CAD model and identifying regions where the digitised model exceeds a tolerance maximum;

the processor in data communication with a controller operable to control a machine to remove material in regions identified in step f) to an extent which brings the regions within the tolerance maximum and minimum; and a machine controlled by the controller.

The processor may be configured to repeat steps c), d) and e) until all regions of the digitised model exceed their tolerance minimum prior to performing step f).

The processor may be further configured, in the event the condition where all regions of the digitised model exceed their tolerance minimum cannot be met, to generate an output recognisable by a user to alert the user to the non-compliance of the component to the pre-defined nominal dimensions and tolerances.

The device for capturing dimensional data is a scanner, for example an optical scanner. The machine may be a CNC operated machine.

An important part of the inventive system is the method used by the processor to align the digital model with the CAD model in such a manner that all minimum tolerance levels are complied with. It will be appreciated this method can be defined in computer code and used to operate a computer to perform the method, thus the method and articles embodying computer code suited for use to operate a computer to perform the method are independently identifiable aspects of a single inventive concept.

According to a second aspect of the invention there is provided a method of assessing a three dimensional component for conformance with nominal dimensions and tolerances as defined in the appended claim 1. Further beneficial features of the invention are recited in the associated dependent claims.

The invention provides for alignment of a virtual component with nominal CAD in a virtual workspace. The assessment of whether and how a component can be machined to nominal, or within defined tolerance limits, can thus be performed prior to any machining operation taking place.

The method of the invention aligns a digitised model of a component with a nominal CAD model of the component by modifying the weighting of one or more regions of the digitised model dependent on the location of said one or more regions relative to the allowable tolerances for the component. In particular, the modification can be achieved by increasing the weighting of any region or regions of the digitised model that is/are located outside a predefined lower deviation from the corresponding region of the CAD model (e.g. inside the smallest allowable dimension for that region), and/or by decreasing the weighting of other regions. This allows the method of the invention to provide an alignment which is extremely sensitive to misalignment caused by missing or negative material compared to nominal (i.e. voids that would have to be filled), while being less sensitive to excess material in regions that could be subsequently machined to conform the part to nominal. The magnitude of the increase and/or decrease applied to different regions may be variable.

In this context, the term "weighting" is to be understood to mean that repositioning of regions which do not exceed a pre-defined lower tolerance such that the pre-defined lower tolerance is exceeded is prioritised over repositioning of regions which have been found to exceed this tolerance minimum. This is intended to position the digitised model such that all regions of the digitised model exceed the pre-defined lower tolerance thereby reducing subsequent processing of the component to material removal operations to bring the component into complete compliance with the CAD model.

The physical component may be scanned in an initial step to create the digital model. The digitised model may be overlaid onto the CAD model prior to the first alignment step.

The predetermined lower deviation for each region of the component may be determined using standard manufacturing tolerances for the component. Numerous different lower deviations could apply to different regions of the component based on a number of parameters including, for example, minimum wall thickness of a particular region.

Alternatively, or additionally, the predetermined lower deviation for each region of the component is adjusted to account for known further machining operations, i.e. to adjust the limit in regions that necessarily require further machining and/or to account for tool capabilities.

Preferably the adjustment is performed automatically without input from a user based on known data of the machining processes in question.

The alignment and assessment of the method may be repeated as required to properly align the digitised model with the CAD model. Due to the complex nature of certain components and the large number of datum points that can be specified, a number of iterations may be required.

The method is of particular benefit when the component is a cast component. The component may be, for example, a nozzle guide vane or blade, possibly from a gas turbine.

The method may additionally output data relating to the final alignment of the digitised model to the CAD model. This data can be used for subsequent processing of the physical component. For example, data may be provided to a CNC machine to remove excess material identified in the final alignment.

The output data may be adjusted to provide an offset. For example, an offset might be required to ensure that subsequent machining does not reduce a wall thickness below an allowable minimum or that sufficient material is left on a datum feature.

The invention also provides a method for machining a component to conformity with nominal dimensions, comprising assessing the component using the method described above and passing the data output to a CNC machine.

A further aspect of the invention provides a data carrier as defined in the appended claim 13. The data carrier may comprise instructions to perform any or all of the method steps defined above.

Apparatus is also provided as defined in the appended claim 14. The apparatus comprises the data carrier and one or more processors for performing the comparison. The data carrier and one or more processors may be separate, or combined as a single unit.

The apparatus may additionally comprise a scanning device for scanning the physical component to collect dimensional data and possibly also create the digitised model. The scanning device may be of a known type using, for example, photogrammetry and/or structured light scanning and/or computerised tomography.

Finally, the invention provides a system for machining a component according to the appended claim 16. The system comprises apparatus as described above, together with a CNC machine to machine the component based on the output from the apparatus.

The invention increases the weighting of non-conforming areas of a part before best fitting the entire part in a virtual workspace which changes the location of the datum features.

The best fit is to be set up to ensure that there is sufficient material (i.e. no missing material) on datum features/points which are used directly to construct the datums, whereas missing material to nominal, but still contained within the lower deviation limit, may be present on multiple features/points which are used in conjunction with each other to construct a feature or point which is then used as the datum. Preferably, through an iterative process, this either brings all areas of the part into conformance to the drawing requirements or determines that the part is not salvageable. It may also then utilise known machining parameters to calculate offsets required when machining to ensure the part conforms after it has been machined.

The invention has the key advantages over the prior art as it reduces the variability of the process due to removing the operator influence. The invention thus leads to increased dimensional capability at the operation, decreased rework at the operation and decreased scrap at the operation.

The invention also allows for greater dimensional control of the component due to the ability to interrogate data from data rich metrology systems, such as but not limited to, optical, laser & computerised tomography.

Wherever practicable, any of the essential or preferable features defined in relation to any one aspect of the invention may be applied to any further aspect. Accordingly the invention may comprise various alternative configurations of the features defined above.

BRIEF DESCRIPTION OF THE DRAWINGS

Practicable embodiments of the invention are described in further detail below by way of example only with reference to the accompanying drawings, of which.

DETAILED DESCRIPTION OF THE INVENTION

Figure 1:
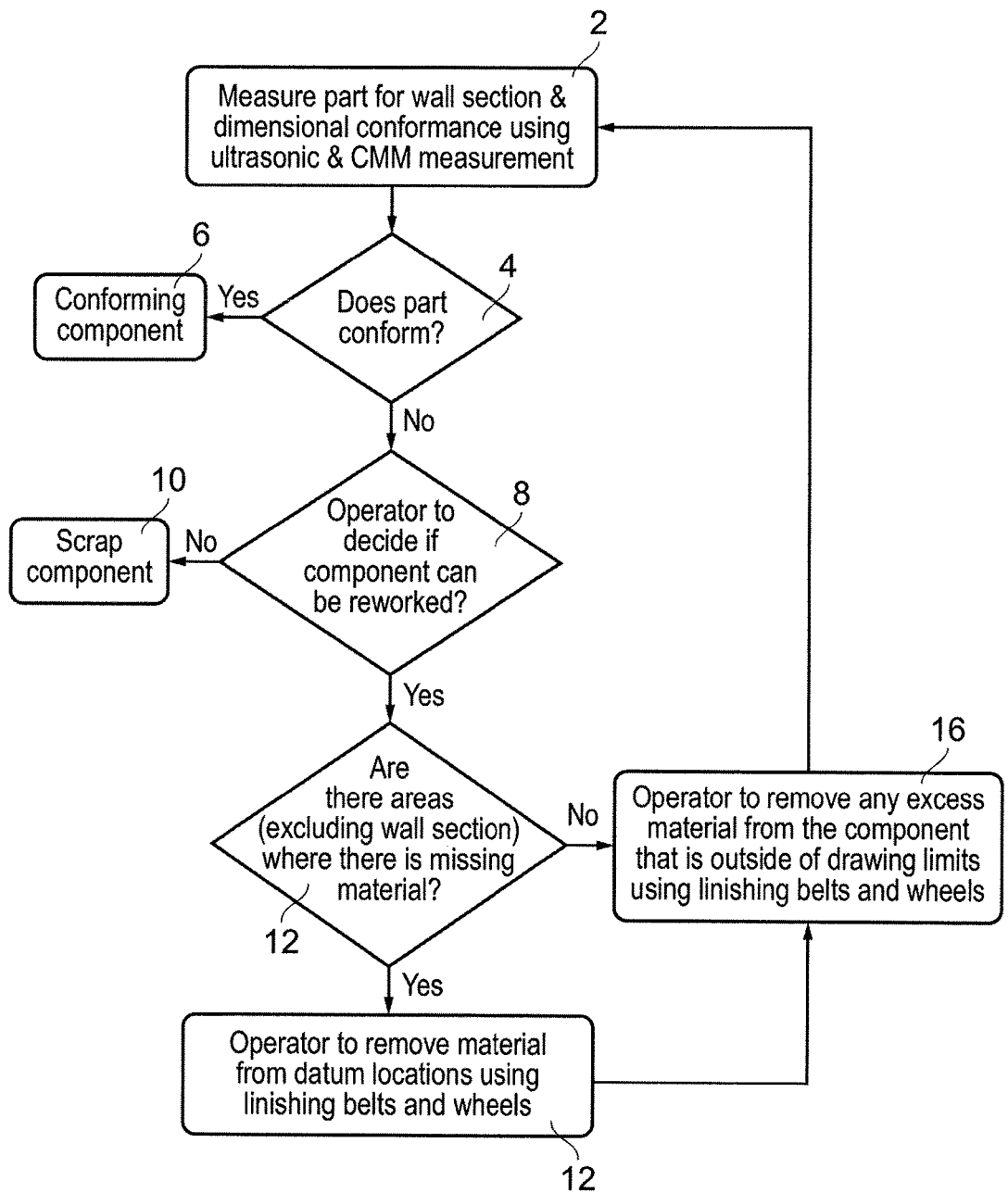
FIG. 1 shows a process flow diagram illustrating the current manual process of inspecting and finishing a component such as a gas turbine Nozzle Guide Vane or Blade.

The current, manual, inspection and reworking process is illustrated in the process flow diagram of FIG. 1. Once a part has been carefully measured using, for example, ultrasonic and CMM measurement 2, it is checked for conformity with the drawings 4. If it is found to conform, then it is simply sent for finishing 6. If, on the other hand, the part is found not to conform with the drawings, then it is left to the operator to decide, using their experience, expertise and judgement, whether or not the part can be salvaged by reworking 8.

If, in the view of the operator, the component cannot be salvaged, then it is simply scrapped 10. If the operator is of the opinion that reworking of the component is possible, then they will proceed to carefully remove material from the component. If there are areas where material is 'missing', compared with the drawings 12, then the operator will first remove material specifically from the datum locations 14, and then more generally from outside the drawing limits 16. If there is no 'missing' material step 14 is omitted. The adapted component is then measured again 2 to see if the reworking has had the desired effect, and the various assessments 4,8,12 and reworking steps 14,16 are repeated if required until either a conforming component 6 or scrap component 10 is produced.

Figure 2A:
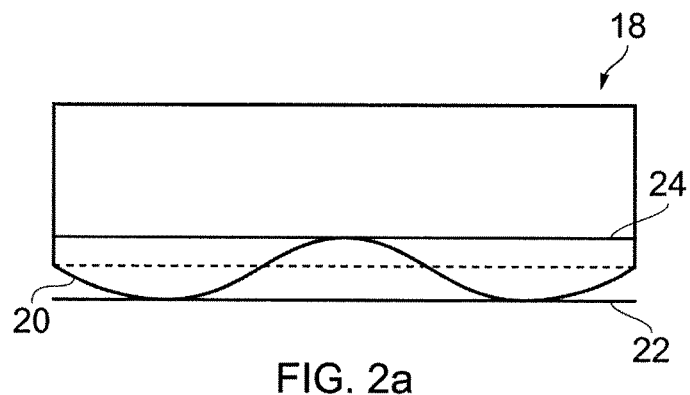
FIGS. 2a to 2c illustrate how a part can be manipulated to conform to a drawing.
Figure 2B:
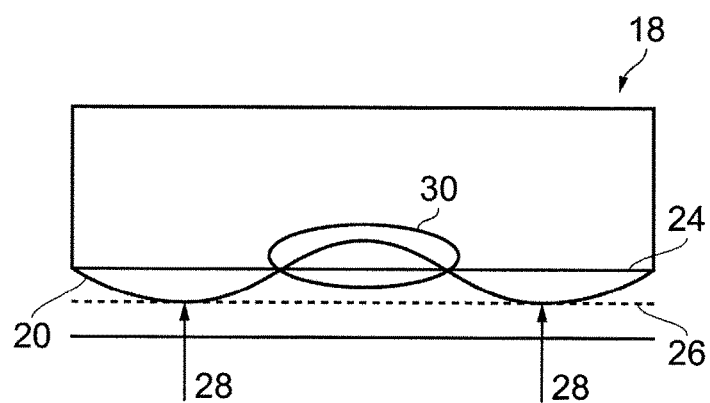
Figure 2C:
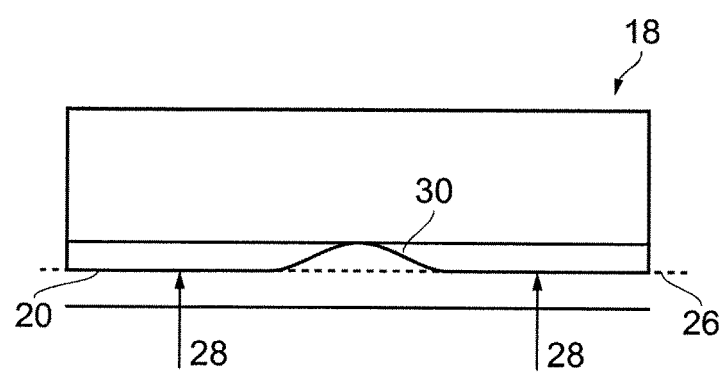

FIGS. 2a to 2c illustrate the process of reworking a component where material is missing at step 12. A basic two dimensional shape 18 is shown for the sake of simplicity, although it is emphasised that in practice the operation would be applied to far more complex three dimensional components.

The shape 18 has an irregular lower edge 20 but, as shown in FIG. 2a, all parts of this lower edge 20 are capable of falling within allowable tolerances between a predetermined upper and lower deviation, defined by solid lines 22 and 24 respectively, when best fit alignment is used. As such, the shape 18 in this example corresponds to a viable component.

In FIG. 2b the same shape 18 is aligned to the nominal dimension (indicated by broken line 26) using datum points 28 on the lower surface 20 of the shape 18. This is the method of alignment typically used during the manufacturing process. Use of the datum points 28 results in a region 30 of the shape 18 falling outside the lower deviation 24 and thus outside the allowable tolerances for the part. This region 30 illustrates the 'missing' material referred to above and, in many cases, the demands placed on the final component due to its operating environment mean that the region 30 cannot simply be filled to salvage the component.

The situation is remedied by removing material selectively from the datum points 28 of the shape 18 until, as illustrated in FIG. 2c, the region 30 of the lower edge 20 moves back within the tolerance band when the datum points 28 are aligned with the nominal dimension 26. This step will only be performed if the operator decides, at step 8 in FIG. 1, that a component is capable of being reworked. This assessment is undertaken by the operator by eye, without knowledge of the best fit alignment shown in FIG. 2a.

It should be understood that the assessment step 8 requires a large element of judgement by the operator in deciding whether a part may be appropriate for reworking. This is especially the case where there is missing material which will require datum points 28 to be adjusted at step 14 in FIG. 1, but minimum wall thickness requirements mean that not every component without missing material would automatically be suitable for reworking. This leads to certain components being scrapped that could have been salvaged, resulting in unnecessary material waste, while other components are reworked when there was never any possibility of providing a conforming part, resulting in wasted processing time and effort.

It should also be understood that the operation illustrated in FIG. 1 will by its nature be highly iterative. The need for extreme care during the removal of material 14,16 during reworking means that material will likely be removed in many stages, with the component being measured 2 and assessed 4,8,12 after each removal operation 14,16. The process illustrated in FIG. 1 could thus be performed multiple times on a single component, without any guarantee of arriving at a conforming part. Attempts to reduce the processing time and the exposure of operators to vibrations from the linishing belts and wheels used to manipulate the datum locations and other areas of the part would increase the likelihood of errors during reworking, resulting in an increased number of scrapped components.

Even if any subsequent reworking of a component is performed perfectly, it is clear that the need to rely on the judgement of an operator, even a highly skilled and experienced operator, at the assessment stage 8 is not ideal.

The invention addresses these issues by providing the methodology required to use software to align the part in a virtual environment in such a way that once the part has been machined it will conform to the drawing when using the drawing datum system. The judgement of the operator can thus be eliminated from the process. In a preferred embodiment, the part can also be reworked using computer numerical control (CNC) machines.

Figure 3:
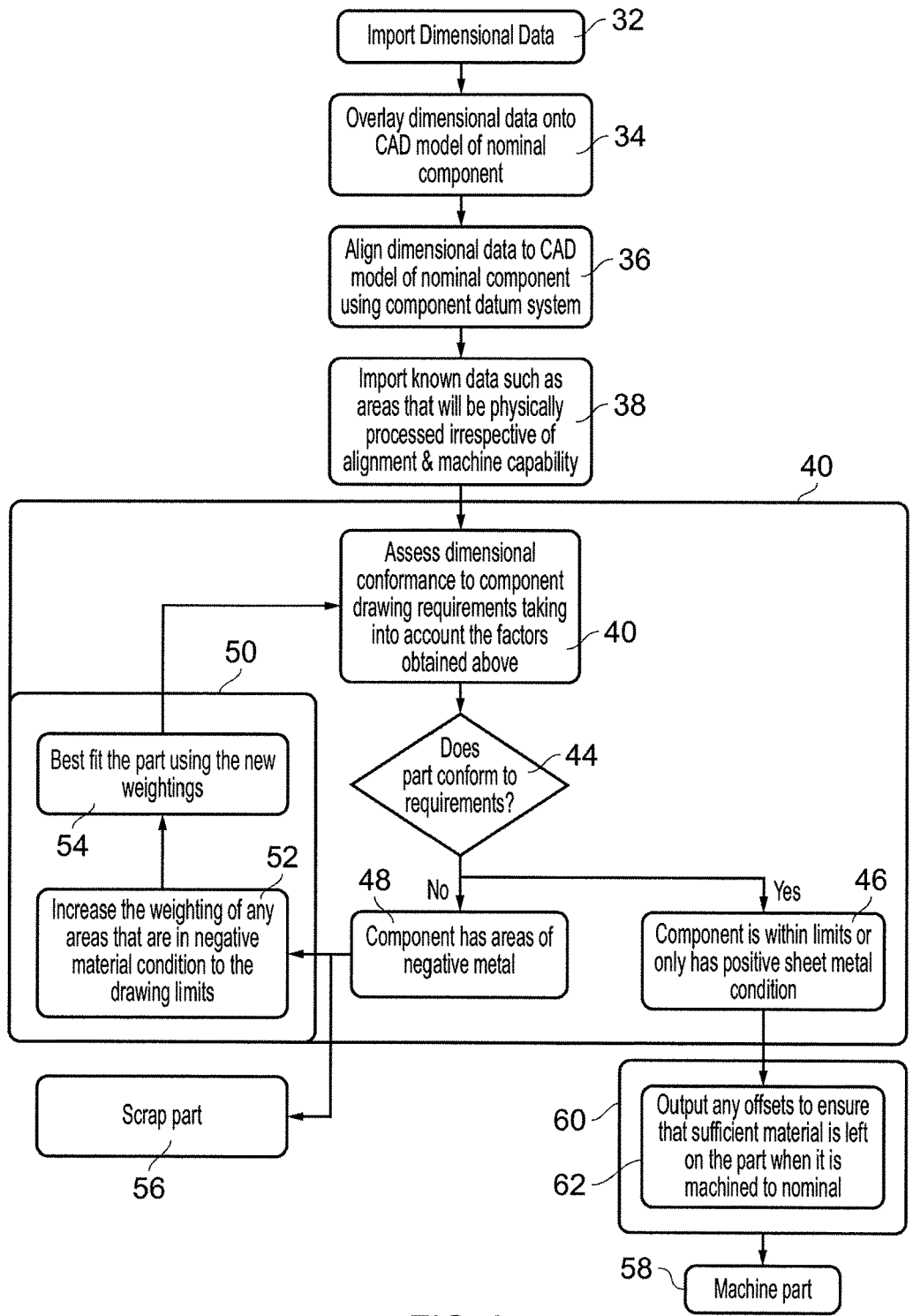
FIG. 3 shows a flow diagram that outlines the processing of a part according to the present invention.

FIG. 3 is a flow diagram that outlines the logic behind the invention.

A component is first scanned 32 using, for example, photogrammetry and/or structured light scanning and/or computerised tomography to generate an accurate virtual representation of the component, including accurate dimensional data and locations of defined datum points. This data is then overlaid onto a CAD model of a nominal component 34 for comparison. The dimensional data is then aligned with the CAD model 36 using a predetermined component datum system, which corresponds to how the physical component would be aligned for further processing operations.

Before any assessment of the alignment is performed, further data is imported 38 to provide information about areas of the component that will necessarily be subjected to further processing, for example in the finishing process. In the current manual process this is a further factor that an operator has to take into consideration, using their personal knowledge and judgement. The system of the invention is able to import the relevant information and adjust the applicable limits/tolerances accordingly.

Once all of the data has been imported, the assessment phase 40 of the operation can begin. First, the dimensional conformance of the virtual component with the nominal CAD model is assessed 42, taking into account not only the general tolerances, but also factors such as machining capability and areas of the part that must be machined (from step 38) to ensure that sufficient material is left on datum features. The system checks 44 whether the virtual component conforms to the requirements, i.e. is within the determined limits or has only positive material that can be readily removed 46, or whether the component has areas of negative/missing material 48.

Where areas of negative/missing material are found in the assessment, the system then moves on to a first adjustment phase 50 where it attempts to bring the virtual component into conformance. The first step 52 is to increase the weighting, or bias value, for any areas of the virtual component that have missing material. The virtual part is then best fit to the CAD model using the revised/modified weighting 54. This has the effect of shifting the virtual model so that areas of missing material 30 are moved towards the lower deviation limit 24 determined based on the various factors imported at steps 32 to 38, essentially moving the virtual model from the condition shown in FIG. 2b to the condition shown in FIG. 2a.

Once the best fit operation 54 has been performed the assessment phase 40 is repeated to again check the virtual component for conformance. If areas of missing material remain, or if new areas of missing material have been created by the adjustment phase 50, then the adjustment phase 50 is either repeated, or the component is determined not to be salvageable and is indicated as a scrap part 56. The adjustment phase 50 can be performed as many times as deemed necessary prior to the component being determined as not salvageable. Once the assessment 40 determines that the virtual component conforms 46 it can them be sent for machining 58. However, a second adjustment phase 60 can be performed by the system prior to this to account for required wall thicknesses or any allowances specified in 38. For example, the first alignment phase 50 could have resulted in a virtual component conforming with the limits around the CAD model, but the resulting position may be such that the machining operation would reduce the wall thickness of an area of the component to an unacceptable level. To counter this, or similar problems, the second adjustment phase 60 allows offsets to be output 62 to ensure that sufficient material remains when the physical component is machined 58.

The process illustrated in FIG. 3 has a number of advantages over that of FIG. 1. The assessment and alignment phases 40,50,60 all take place in a virtual environment, before any material is removed from a part. Any necessary iterations can therefore be performed quickly, and any parts not suitable for reworking can be identified and scrapped without the wasted effort of removing material physically. For a conforming part, the results of the alignment processes 50,60 provide precise information about how much material needs to be removed and from what locations before the machining operation is commenced. This provides a clear benefit even where the subsequent machining is performed by hand, but it is envisaged that CNC machining will be used to ensure accuracy and conformance with the data provided.

The invention will allow a greater number of components to be salvaged by performing a full assessment that even a highly skilled and experienced operator would likely not be able to replicate. In particular, by removing the element of human judgement from the assessment stage the invention makes it possible to salvage components that operators would likely deem either impossible or too difficult to rework. By providing precise information about how the part should be machined in order to conform, the invention also allows the use of CNC machining, and the greater precision available allows still further borderline components to be salvaged. The virtual assessment also allows the identification of parts that cannot be salvaged, even after an iterative assessment, without any need for wasted physical working of the part. All of these benefits reduce losses of time and materials compared with the current manual system, and thus result in cost and time savings during the manufacturing process, and in a lower overall component cost.

The improved dimensional control provided by the invention will additionally improve the uniformity of final components produced and their correspondence with the ideal, nominal, design. In particular in the case of NGVs, blades and other turbine components, this results in a decrease in the engine's specific fuel consumption, resulting in more efficient engines with lower running costs and lower environmental impact.

The invention also removes or minimises the health and safety risks associated with the manual aspect of the reworking operation. Even where the reworking is performed by hand, the information provided by the alignment system removes the iterative nature of the physical machining process and the associated time a user would spend subjected to vibration, as well as avoiding the unnecessary physical reworking of components that cannot be salvaged.

This invention could be applied to any part where there is a defined datum system and where virtual environments are being used to align parts prior to their physical processing to bring them into dimensional conformance using prior data obtained from one or multiple pieces of dimensional metrology equipment. In addition to NGVs and blades this could also apply to parts which use a datum system on an aerofoil shape, any precision cast part, a part with complex geometry or where the datum system isn't clear or located on a finished surface. Possible examples of this could be the correction of propeller blades within the marine industry or the correction of ceramic cores that are to be used in the manufacture of items such as NGVs and blades.

This invention could be applied in general to manufacturing processes where virtual methods are being employed to calculate the modification of a datum feature required to bring a previously non-conforming part back into the design specifications. Although the alignment process is described above as increasing the weighting, or bias value, for any areas of the virtual component that have missing material, it should be appreciated that the same effect could be achieved by reducing the weighting/bias value of the areas that do not have missing material.

The invention claimed is:

1. A system for the reworking of a three dimensional component to conform with pre-defined nominal dimensions and tolerances defined by a maximum tolerance and a minimum tolerance for any given region of the component, the system comprising:
    an optical scanner configured to capture dimensional data of the three dimensional component by measuring dimensions of the three dimensional component;
    a CNC machine configured to remove material from the three dimensional component; and
    a processor being in data communication with the device, the processor including a memory in which the pre-defined nominal dimensions and tolerances are stored as a nominal CAD model, the processor being configured to:
    a) create a virtual digitised model of the three dimensional component based on the measured dimensions of the three dimensional component from the captured dimensional data;
    b) align the virtual digitised model with the nominal CAD model based on a component datum system;
    c) assess the correspondence of the virtual digitised model with the nominal CAD model;
    d) compare one or more regions of the virtual digitised model with the nominal CAD model and identifying regions where the virtual digitised model does not exceed a predetermined tolerance minimum;
    e) adjust the alignment of the virtual digitised model with the nominal CAD model to bring regions identified in step d) to a position where the one or more regions meet or exceed the tolerance minimum;
    f) compare the one or more regions of the virtual digitised model with the nominal CAD model and identifying defective regions where the virtual digitised model exceeds a predetermined tolerance maximum; and
    g) removing material, by the CNC machine, from the defective regions as identified in step f) such that the defective regions in the three dimensional component are corrected to comply with the tolerance maximum and the tolerance minimum.

2. The system as claimed in claim 1 wherein the processor is configured to repeat steps c), d) and e) until all regions of the virtual digitised model exceed their tolerance minimum prior to performing step f).

3. The system as claimed in claim 2 wherein the processor is configured, in the event the condition where all regions of the virtual digitised model exceed their tolerance minimum are not met, to generate an output recognisable by a user to alert the user to the non-compliance of the three dimensional component to the pre-defined nominal dimensions and tolerances.

4. A method of assessing a three dimensional component for conformance with nominal dimensions and tolerances, the method comprising the steps of:
    a) measuring, by an optical scanner, dimensions of a three dimensional component and create a virtual digitised model based on the measured dimensions of the three dimensional component;
    b) aligning the virtual digitised model with a nominal CAD model of the three dimensional component based on a component datum system;
    c) assessing the correspondence of the virtual digitised model with the nominal CAD model;
    d) modifying the weighting of one or more regions of the virtual digitised model based on a comparison with the tolerances of a corresponding region of the nominal CAD model; and
    e) performing a best fit alignment of the virtual digitised model with the nominal CAD model based on the modified weightings;
    f) comparing the one or more regions of the virtual digitised model with the nominal CAD model and identifying defective regions where the virtual digitised model exceeds a predetermined tolerance maximum or a predetermined tolerance minimum; and
    g) removing material, by a CNC machine, from the defective regions as identified in step f) such that the defective regions in the three dimensional component are corrected to comply with the tolerance maximum or the tolerance minimum.

5. The method according to claim 4, wherein step d) comprises increasing the weighting of any region of the virtual digitised model that is located outside a predefined lower deviation from the corresponding region of the nominal CAD model.

6. The method according to claim 5, wherein step d) comprises reducing the weighting of any region of the virtual digitised model that is not located outside a pre-defined lower deviation from the corresponding region of the nominal CAD model.

7. The method according to claim 4, wherein the virtual digitised model is overlaid onto the nominal CAD model prior to the first alignment step.

8. The method according to claim 4, wherein steps c), d) and e) are repeated.

9. The method according to claim 4, further comprising the step of outputting data relating to the final alignment of the virtual digitised model to the nominal CAD model.

10. The method according to claim 9, wherein the data output is adjusted to provide an offset.

11. A data carrier comprising:
    one or more processors programmed to:
    h) measure, by an optical scanner, dimensions of a physical component and create a virtual digitised model based on the measured dimensions of the physical component;
    i) align the virtual digitised model with a nominal CAD model of the physical component based on a component datum system;
    j) assess the correspondence of the virtual digitised model with the nominal CAD model;
    k) modify the weighting of one or more regions of the virtual digitised model based on a comparison with the tolerances of a corresponding region of the nominal CAD model;

l) perform a best fit alignment of the virtual digitised model with the nominal CAD model based on the modified weightings;

m) compare the one or more regions of the virtual digitised model with the nominal CAD model and identifying defective regions where the virtual digitised model exceeds a predetermined tolerance maximum or a predetermined tolerance minimum; and n) remove material, by a CNC machine, from the defective regions as identified in step f) such that the defective regions in the physical component are corrected to comply with the tolerance maximum or the tolerance minimum.

12. The data carrier according to claim 11, wherein step d) comprises increasing the weighting of any region of the virtual digitised model that is located outside a predefined lower deviation from the corresponding region of the nominal CAD model.

13. The data carrier according to claim 11, wherein step d) comprises reducing the weighting of any region of the virtual digitised model that is not located outside a predefined lower deviation from the corresponding region of the nominal CAD model.

14. An apparatus for assessing a physical component for conformance with nominal dimensions and tolerances, comprising:
the data carrier according to claim 11 and one or more processors for performing the comparison.

15. A turbine blade or nozzle guide vane manufactured via the system of claim 1.

16. A method for manufacture of a turbine blade or a nozzle guide vane comprising:
casting the blade or guide vane to a pre-defined shape;
assessing the cast blade or guide vane for compliance with a nominal CAD model via the method of claim 4;
performing one or more finishing operations, including operations to remove any material which exceeds an upper tolerance of the nominal CAD model whereby to bring the turbine blade or nozzle guide vane into compliance with the nominal CAD model.

* * * * *